(12) United States Patent
Singh et al.

(10) Patent No.: US 9,167,023 B2
(45) Date of Patent: Oct. 20, 2015

(54) POWER MEASUREMENT CIRCUIT

(71) Applicant: STMicroelectronics International N.V., Amsterdam (NL)

(72) Inventors: Surinder Pal Singh, Noida (IN); Kaushik Saha, Delhi (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 60 days.

(21) Appl. No.: 14/078,118

(22) Filed: Nov. 12, 2013

(65) Prior Publication Data

US 2014/0062460 A1    Mar. 6, 2014

Related U.S. Application Data

(62) Division of application No. 12/842,256, filed on Jul. 23, 2010, now Pat. No. 8,587,292.

(30) Foreign Application Priority Data

May 28, 2010    (IN) .......................... 1229/DEL/2010

(51) Int. Cl.
| | |
|---|---|
| G01R 19/18 | (2006.01) |
| H04L 29/08 | (2006.01) |
| G01R 21/133 | (2006.01) |
| G01R 19/22 | (2006.01) |
| H04L 12/24 | (2006.01) |

(52) U.S. Cl.
CPC .............. *H04L 67/025* (2013.01); *G01R 19/22* (2013.01); *G01R 21/133* (2013.01); *H04L 41/32* (2013.01)

(58) Field of Classification Search
CPC .. G01R 21/133; G01R 19/2513; G01R 19/22; G01R 21/00; G01R 22/10; G01R 33/07
See application file for complete search history.

(56) References Cited

U.S. PATENT DOCUMENTS

| | | | |
|---|---|---|---|
| 6,957,158 B1 * | 10/2005 | Hancock et al. | ................. 702/61 |
| 7,062,164 B2 | 6/2006 | Ames et al. | |
| 7,336,065 B1 * | 2/2008 | Hyatt et al. | ................... 324/142 |
| 7,961,546 B2 | 6/2011 | Mair et al. | |
| 8,259,081 B2 | 9/2012 | Keskin | |
| 2009/0039848 A1 | 2/2009 | Lo et al. | |

* cited by examiner

*Primary Examiner* — Tung X Nguyen

(74) *Attorney, Agent, or Firm* — Allen, Dyer, Doppelt, Milbrath & Gilchrist, P.A.

(57) ABSTRACT

A system for power measurement in an electronic device includes a sensing unit, an analog-to-digital converter (ADC) and a controller. The sensing unit senses voltage across a power source and modulates a carrier signal based on the sensed voltage. The ADC converts a combination of the modulated carrier signal and audio signals received by the electronic device to generate a digitized combined signal and provides the digitized combined signal to the controller. The controller separates digitized modulated carrier signal and digitized audio signals. The digitized modulated carrier signal is demodulated to generate an output signal that provides a measure of the power consumed by the electronic device.

18 Claims, 5 Drawing Sheets

POWER MEASUREMENT CIRCUIT

RELATED APPLICATIONS

The present application is a divisional U.S. patent application Ser. No. 12/842,256, filed Jul. 23, 2010, now U.S. U.S. Pat. No. 8,587,292 which claims the benefit of priority Indian Patent Application No. 1229/DEL/2010 filed May 28, 2010, both of which are incorporated herein by reference in their entireties.

TECHNICAL FIELD

The present invention relates to integrated circuit (IC) chips, and more particularly, to power measurement in IC chips.

BACKGROUND

With current advancements in technology, IC chips have become increasingly complex and achieve a high level of integration. Today, IC chips are used to perform various functions in electronic devices, such as mobile phones, cameras, set-top boxes, and personal digital assistants (PDAs).

The IC chip typically includes a power management system which manages, amongst other things, the power supplied to the IC chip. The power management system further includes a power measurement circuit for estimating the power consumed by the IC chip. The power measurement circuit estimates the power consumed by the IC chip, by measuring a current drawn from a power source.

Power is generally measured by placing a sensor, for example, a resistor, across the power source. The voltage drop across the sensor is sensed. The sensed voltage is provided to the power management system in the IC, for managing the power requirement in the IC chips. However, interfacing of the sensed voltage with the power management system in the IC chip requires additional components and engages pins of the IC chip, thereby increasing cost and reduced functionalities of the electronic device.

SUMMARY

This summary is provided to introduce concepts related to power measurement in an IC chip, which are further elaborated in the detailed description. This summary is not intended to identify essential features of the claimed subject matter nor is it intended for use in determining or limiting the scope of the claimed subject matter.

In an implementation of the present subject matter, voltage drop across a power source coupled to an electronic device is sensed. The sensed voltage is used to modulate a carrier signal. The electronic device generally receives one or more audio signals. The received audio signals and the modulated carrier signal are combined together and digitized. The digitized combined signal is processed to separate the digitized modulated carrier signal from the digitized audio signals. The digitized modulated carrier signal is demodulated to generate an output signal, which provides a measure of the power consumed by the electronic device.

These and other features, aspects, and advantages of the present subject matter will be better understood with reference to the following description and appended claims. This summary is provided to introduce a selection of concepts. This summary is not intended to identify key features or essential features of the claimed subject matter, nor is it intended to be used for to limiting the scope of the claimed subject matter.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION OF PREFERRED EMBODIMENTS

Figure 1:
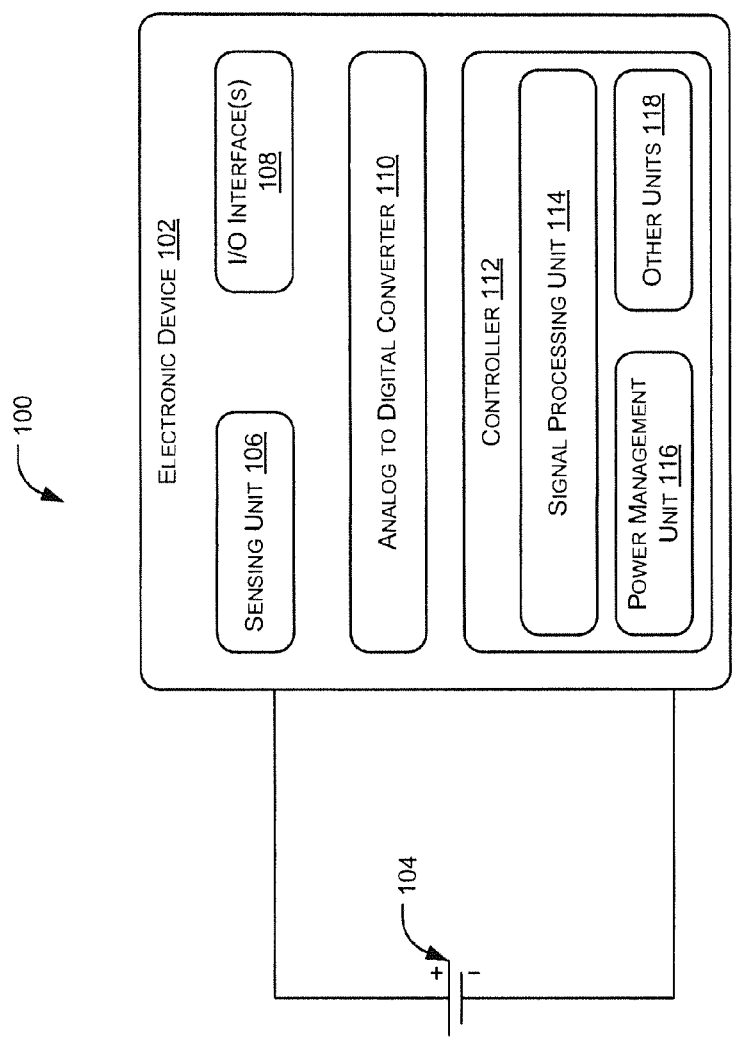
FIG. 1 illustrates an exemplary system for power measurement, in accordance with an embodiment of the present subject matter.

The disclosed subject matter relates to power measurement in IC chips. Particularly, the subject matter relates to a power measurement circuit of an IC chip that is configured to receive analog audio signals.

Presently, the IC chips used in electronics devices, such as mobile phones, cameras, PDAs, and set-top boxes, are operated using an external power supply, for example, a battery. The power consumption within such electronics devices varies with the functionalities and the operations being performed using the electronic devices. For example, the power consumption in the electronic device would increase with an increase in usage of the electronic device. Similarly, during instances of low usage, the power consumption would also be low. However, it should be noted that the power within the battery gets depleted during the course of time.

Generally, a power management system is provided to minimize the power consumed in the electronic devices. For example, the power management system may reduce the power requirements of the electronic device depending on whether the electronic device is functioning in an idle mode. For the purpose, a measurement of the power consumed from the battery is desired.

Conventionally, power consumption of an electronic device is estimated by measuring the current that is drawn from the battery by the electronic device. For this, voltage across a sensor, for example, a resistor, is sensed. The sensed voltage, which is a direct current (DC) voltage, may be digitized and then provided to the power management system associated with the electronic device. As the resistance of the sensor is known, the power management system can estimate the current drawn based on the sensed voltage. This estimate could be used for power management in the electronic device.

The digitization of the sensed voltage for the estimation of the power being consumed can be performed by various ways. The sensed voltage can be provided to a terminal of a three terminal device, for example, the gate terminal of a transistor. As is known, the current through two terminals of the transistor is based on the voltage applied at its third terminal. Thus, the current through drain and source terminals of the transistor may vary based on the sensed voltage applied at the gate terminal of the transistor. Such a varying current can be digitized, say by using an analog-to-digital converter (ADC).

Alternatively, the sensed voltage can be used to drive a voltage controlled oscillator (VCO). Depending on the sensed voltage, the frequency of the signal generated by the VCO varies. The generated signal can be provided to a counter to measure the variation in the frequency and determine the average value of the sensed voltage. However, in both the cases, additional components, such as the ADC, are required to provide the measurement of the sensed voltage to the power management system in the electronic device.

Electronic devices, such as mobile phones, may typically receive audio signals for various functions. For example, in a mobile phone, audio signals from a user can be received during a mobile phone call. The ADC is generally used for interfacing audio signals with an IC chip of an electronic device. The audio signals are alternating current (AC) signals. The ADC converts the audio signals to digital audio signals that are provided to the IC chip. In some cases, a capacitor can be coupled to the ADC to remove unwanted direct current (DC) signals which may be interfaced to the IC chip along with the received audio signals. The sensed voltage, as mentioned previously, is a DC voltage. Thus, the same ADC cannot be used to transfer both the audio signals and the sensed voltage to the IC chip. Moreover, if the sensed voltage (which is a DC signal) is added to the audio signal (which is an AC signal), then both of the signals will lose their meaningful values.

To this end, systems and methods for power measurement in the electronic device are described herein. In an implementation, a sensor is placed across a power source to measure power consumption of an IC chip in an electronic device. A voltage drop across the sensor is sensed. The sensed voltage is digitized using an ADC, which is also configured to communicate audio signals to the IC chip.

To reliably communicate both the sensed voltage and the audio signals, the sensed voltage is used to modulate a carrier signal. The frequency of the carrier signal is selected such that there is minimal interference of the modulated carrier signal with the frequency spectrum of the audio signals. In an implementation, the frequency of the carrier signal chosen for the modulation is greater than the audio frequency range.

The modulated carrier signal and the audio signals are combined to generate a combined signal. Subsequently, the combined signal is digitized. The digitized combined signal includes the digitized components of both the modulated carrier signal, as well as the audio signal. From the digitized combined signal, the digitized modulated carrier signal components can be removed, say by filtering out the digitized modulated carrier signal. In an implementation, a high pass filter can be used to block the digitized audio signals and allow the digitized modulated carrier signal to pass. The filtered modulated carrier signal can be demodulated to provide an estimate of the sensed voltage.

The method, thus, uses existing components for measuring the power consumed by the IC chip without requiring any additional number of components. Further, as the ADC is also used to interface the IC chip, additional pins of the IC chip are available to provide other functions in the electronic device.

While aspects of described systems and methods for the power measurement circuit in an electronic device can be implemented in any number of different environments, and/or configurations, the embodiments are described in the context of the following exemplary system architecture(s).

The descriptions and details of well-known devices and components are omitted for simplicity of the description. Although the devices are explained as certain N-channel and P-channel devices, it can be appreciated that complementary devices are also possible in accordance with the present subject matter. Accordingly, the logic level of control signals can either be active low or active high.

FIG. 1 illustrates an exemplary system 100 for power measurement, in accordance with an embodiment of the present subject matter. The system 100 includes an electronic device 102 coupled to a power source 104. The power source 104 provides power for the operation of the electronic device 102. Examples of the electronic device 102 include, but are not limited to, mobile phones, PDAs, cameras, music players, video players, recorders, and televisions.

The electronic device 102 includes a sensing unit 106, one or more input/output (I/O) interface(s) 108, an ADC 110, and a controller 112. The sensing unit 106 senses power being consumed by the electronic device 102. In an implementation, the sensing unit 106 senses voltage drop across a sensor coupled to the power source 104. In another implementation, the sensing unit 106 is configured to modulate a carrier signal based on the sensed voltage to generate a modulated carrier signal.

The I/O interface(s) 108 interfaces the electronic device 102 with a user or other external devices. The I/O interface(s) 108 may include a variety of software and hardware interfaces, for example, interfaces for peripheral device(s) such as a keyboard, a microphone, a key-pad, a display screen, a mouse, an external memory, and a printer. For example, a microphone interfaces audio signals from a user to a mobile phone by using an ADC, such as the ADC 110.

The ADC 110 converts analog signals to digital signals. The ADC 110 can receive analog signals from the sensing unit 106 as well as from the I/O interface(s) 108. On receiving the analog signals, the ADC 110 converts the analog signals to digital signals and provides the digital signals to the controller 112. The ADC 110 can be of different resolutions, for example, 8 bits, 16 bits, and 32 bits. To implement the ADC 110, ADCs having different dynamic range may be used based on the frequency range of the signals being received by the ADC 110. A dynamic range of an ADC indicates the frequency range of input signals that can be reliably converted to digital signals. For example, for audio signals, the ADC 110 should reliably convert signals having a frequency in the range of about 20 Hz to 20 KHz.

The controller 112 is configured to perform various functions of the electronic device 102. Among other things, the controller 112 manages the power requirements of the electronic device 102. The controller 112 includes a signal processing unit 114, a power management unit 116, and other units 118. The signal processing unit 114 filters a digitized modulated carrier signal from digital signals received by the controller 112. Further, the signal processing unit 114 demodulates the digitized modulated carrier signal to generate an output signal that is based on the sensed voltage. In an implementation, the digital signals can be received from the ADC 110.

The power management unit 116 manages the power requirements of the electronic device 102 based on the output signal that is based on the sensed voltage. In an implementation, the power management unit 116 controls power supply to certain components of the electronic device 102 based on the output signal. For example, in a mobile phone, the power management unit 116 can adaptively control LCD backlight display based on the output signal which provides a measure of the power being consumed by the mobile phone.

In an implementation, the power management unit 116 estimates the power requirements of the electronic device 102. Based on a difference of required power and measured power, the power management unit 116 can configure various components of the electronic device 102 to operate at an optimal operating point, for proper functioning of the electronic device 102.

It is to be noted that the controller 112 may be implemented in a single IC chip, or in a combination of IC chips. Further, the components of the electronic device 102 can be integrated together to form a system-on-a-chip.

In operation, signals, for example, audio signals, from the I/O interface(s) 108 are sent to the ADC 110. Also, the sensing unit 106 senses the voltage across the power source 104 using a sensor. Once the sensed voltage is obtained, the sensing unit 106 generates the carrier signal and then modulates the carrier signal based on the sensed voltage. In one implementation, the sensing unit 106 performs amplitude modulation of the carrier signal based on the sensed voltage.

The frequency of the carrier signal is chosen such that the carrier signal does not interfere with the frequency of the audio signals received by the ADC 110. In one implementation, the frequency of the carrier signal is selected by the sensing unit 106. The modulated carrier signal is sent to the ADC 110. The ADC 110 digitizes a combination of the audio signals received from the I/O interface(s) 108 and the modulated carrier signal received from the sensing unit 106 and generates a digitized combined signal. The digitized combined signal generated by the ADC 110 is passed to the controller 112.

The signal processing unit 114 of the controller 112 separates the digitized combined signal into the digitized modulated carrier signal and the digitized audio signals. In an implementation, the signal processing unit 114 filters the digitized modulated carrier signal from the digitized combined signal. The signal processing unit 114 demodulates the digitized modulated carrier signal to generate an output signal.

It would be noted that the output signal would be based on the modulated carrier signal, and in turn also based on the sensed voltage. The output signal thus provides an estimate of the power consumed by the electronic device 102. Further, the output signal is provided to the power management unit 116, which manages the power requirements of the electronic device 102. In an implementation, the power management unit 116 can include a control loop having a reference input of the power requirements of the electronic device 102. Based on a comparison of the output signal with the reference input, the power management unit 116 can adjust various components of the electronic device 102 to appropriate operating points such that the reference input is matched.

The digitized audio signals filtered by the signal processing unit 114, on the other hand, are passed on to the other units 118 for further processing. For example, in a mobile phone, the audio signals can be communicated from one mobile phone to another using the other units 118.

Figure 2:
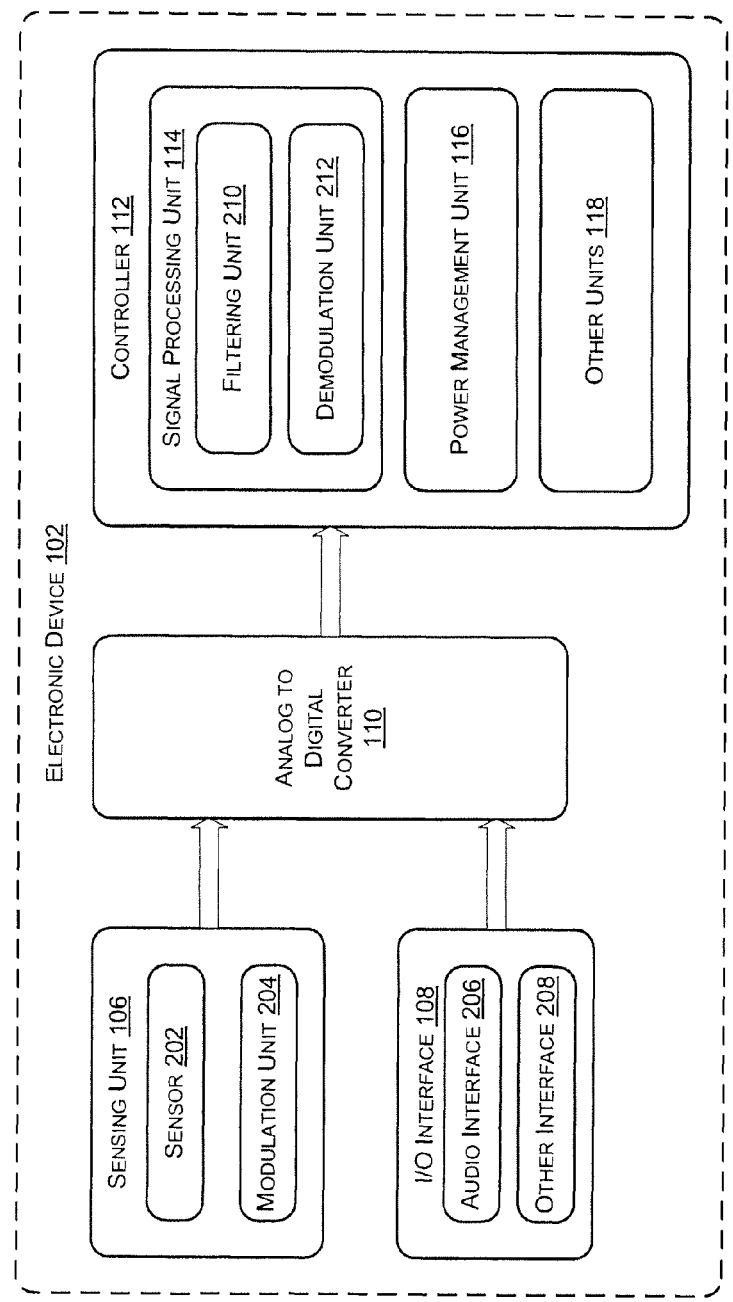
FIG. 2 illustrates an exemplary device having a power measurement circuit, in accordance with an embodiment of the present subject matter.

FIG. 2 illustrates the electronic device 102, in accordance with an embodiment of the present subject matter. The components of the electronic device 102 may be implemented using multiple circuits working in cooperation, or may be integrated together to form a single system-on-a-chip (SOC). The embodiment illustrated in the following paragraphs, is for the purpose of illustration only. A plurality of other components can also be included to implement multiple functionalities within the electronic device 102.

As indicated previously, the electronic device 102 includes the sensing unit 106, the I/O interface(s) 108, the ADC 110, and the controller 112. The sensing unit 106 includes a sensor 202 for sensing the power consumed by the electronic device 102 from the power supply 104. The voltage drop across the sensor, hereinafter referred to as sensed voltage, is sensed. In an implementation, the sensor 202 can be a resistor commonly known in the art, across which a voltage drop is sensed. However, other implementations of the sensor 202, for example, a low dropout voltage regulator, are also within the scope of the present subject matter.

The sensing unit 106 also includes a modulation unit 204 for modulating a carrier signal based on the sensed voltage. In an implementation, the modulation unit 204 generates the carrier signal. The carrier signal can be generated by using circuits commonly known in the art, for example, a Wien bridge oscillator.

The I/O interface(s) 108 includes an audio interface 206 and other interface(s) 208. The audio interface 206 receives audio signals from external devices or a user, and sends them to the controller 112. In an implementation, the audio interface 206 passes the audio signals through the ADC 110. The audio interface 206 can include a microphone for receiving the audio signals.

The other interface(s) 208 receive other inputs, for example, key strokes, mouse, video signals, etc., from the user or external devices. The other interface(s) 208 may include, but are not limited to, display screens, touch pads, key pads, key boards, and mouse.

Further, the signal processing unit 114 includes a filtering unit 210 and a demodulation unit 212. The filtering unit 210 filters the digitized modulated carrier signal from the digitized combined signal received from the ADC 110. In one implementation, the filtering unit 210 can be implemented using a high pass filter for filtering the digitized modulated carrier signal. However, any other implementation of the filtering unit 210 for filtering the digitized modulated carrier signal is also possible. The filtering unit 210 may be implemented as hardware using components such as resistors, capacitors, and inductors, or as software in an IC. In one implementation, the filtering unit 210 can be configured to separately provide the digitized modulated carrier signal and the digitized audio signal.

Once obtained, the demodulation unit 212 demodulates the digitized modulated carrier signal to generate an output signal. In an implementation, the demodulation unit 212 can be an envelope detector for demodulating the digitized modulated carrier signal. However, other implementations of the demodulation unit 212 based on the type of modulation scheme used are also within the scope of the invention. As indicated previously, the output signal is based on the modulated carrier signal, which in turn is based on the sensed voltage. The output signal can, therefore, be used to provide an estimate of the power consumed by the electronic device 102.

In operation, the voltage across the sensor 202 is sensed to determine the power drawn from the power supply 104. The modulation unit 204 generates a carrier signal. The frequency of the carrier signal is so selected so that it causes minimal or no interference with the audio signals, such as the audio signals received by the audio interface 206. The modulation unit 204 modulates the carrier signal based on the sensed voltage. In an implementation, the modulation unit 204 performs amplitude modulation of the carrier signal. In another implementation, the modulation unit 204 amplifies the sensed voltage before modulating the carrier signal. The modulation unit 204 sends the modulated carrier signal to the ADC 110.

The ADC 110 receives the modulated carrier signal from the modulation unit 204, and the audio signals from the audio interface 206. The ADC 110 digitizes the modulated carrier signal and the audio signals. The modulated carrier signal and the audio signals are combined together and then digitized using the ADC 110. In an implementation, the modulated carrier signal and the audio signals are added together using an adder circuit. The ADC 110 sends the digitized combined signal to the signal processing unit 114.

The filtering unit 210 filters the digitized modulated carrier signal from the digitized combined signal. The digitized modulated carrier signal is then passed to the demodulation unit 212. The demodulation unit 212 demodulates the digitized modulated carrier signal to generate the output signal. The output signal is based on the sensed voltage which was measured across the sensor 202. As indicated previously, the sensed voltage provides an estimate of the power consumed by the electronic device 102. The output signal is sent to the power management unit 116 for power management operations in the electronic device 102, as described earlier.

Figure 3:
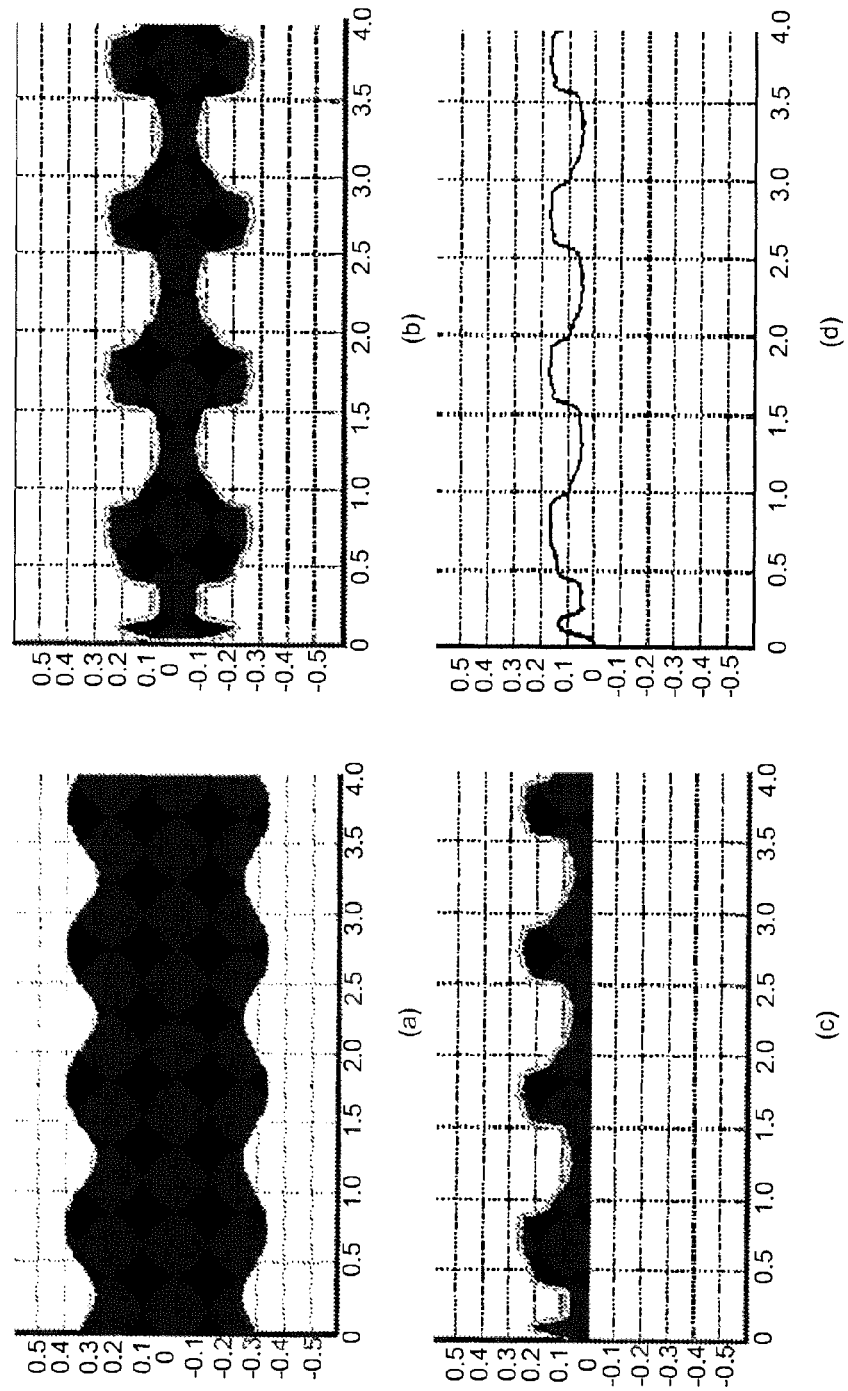
FIG. 3 illustrates graphs of signals generated during the power measurement, in accordance with an embodiment of the present subject matter.

These and other aspects can be better understood in conjunction with the signal graphs, as shown in FIG. 3. It is to be noted that the graphs represent digital signals with the horizontal axis representing time, while the vertical axis representing the magnitude of the signal.

FIG. 3 (*a*) illustrates a graph of the digitized combined signal, as generated by the ADC 110. The digitized combined signal, as mentioned previously, is a mixture of the audio signals received from the audio interface 206 and the modulated carrier signal from the modulation unit 204. The ADC 110 provides the digitized combined signal to the controller 112.

The filtering unit 210 receives the digitized combined signal and filters out the digitized modulated carrier signal, as shown in FIG. 3 (*b*). The digitized modulated carrier signal shown in FIG. 3 (*b*) is an amplitude modulated carrier signal. The amplitude of the digitized modulated carrier signal is based on the sensed voltage.

Once the digitized modulated carrier signal is obtained, it is passed to the demodulation unit 212. The demodulation unit 212 demodulates the digitized modulated carrier signal to generate the output signal, which is represented in FIG. 3 (*c*), as per one implementation of the present subject matter. In such an implementation, when the modulated carrier signal is amplitude modulated, the demodulation unit 212 detects the envelope of the digitized modulated carrier signal and generates the output signal based on the detected envelope. The demodulation unit 212 then provides a measure of the output signal, represented in FIG. 3 (*d*). This output signal can be provided to the power management unit 116 for its operation. It would be appreciated that the signal graphs have been shown for illustration purposes only, and the scope of the present subject matter should not be construed as limited to these graphs only.

Figure 4:
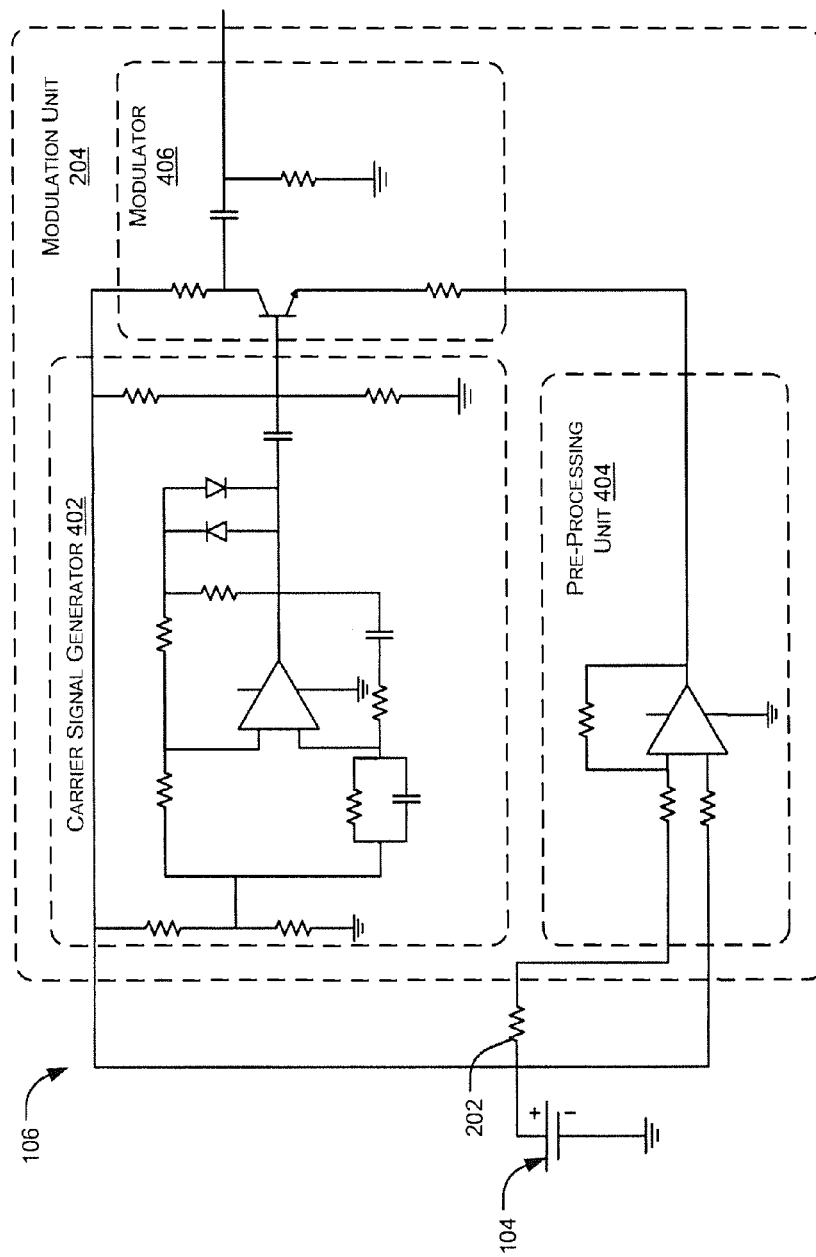
FIG. 4 illustrates an exemplary sensing circuit, in accordance with an embodiment of the present subject matter.

FIG. 4 illustrates an exemplary circuit of the sensing unit 106 for generating the modulated carrier signal, in accordance with an embodiment of the present subject matter. The sensor 202 is illustrated as a resistor. However, any other implementation of the sensor 202, such as a voltage regulator, is also possible. The modulation unit 204 is configured to perform amplitude modulation of the sensed voltage across the sensor 202. In an implementation, the modulation unit 204 includes a carrier signal generator 402, a pre-processing unit 404, and a modulator 406.

The carrier signal generator 402 is configured to generate a carrier signal that is modulated based on the sensed voltage. In an implementation, the frequency of the carrier signal generated by the carrier signal generator 402 can be above the audio frequency range (20 Hz to 20 KHz). In a one embodiment, the frequency of the carrier signal generated is about 20 KHz. The carrier signal generator 402 can be implemented using standard components such as transistors, operational amplifiers, capacitors, and resistors, known in the art. For illustration purposes, the carrier signal generator 402 shown is a Wien bridge oscillator circuit.

The pre-processing unit 404 amplifies the sensed voltage for effective measurement. In an implementation, the pre-processing unit 404 includes an operational amplifier and one or more resistors. The pre-processing unit 404 and the carrier signal generator 402 are coupled to the modulator 406. The modulator 406 modulates the carrier signal from the carrier signal generator 402 based on the sensed voltage received from the pre-processing unit 404. In an implementation, the modulator 406 performs amplitude modulation of the carrier signal based on the sensed voltage. The modulator 406 may further include an amplitude modulator (A.M) 408 for transmitting the amplitude modulated carrier signal.

In operation, the sensor 202 senses voltage across the power source 104 to generate the sensed voltage. The pre-processing unit 404 amplifies the sensed voltage so that the carrier signal generated by the carrier signal generator 402 can be effectively modulated. The modulator 406 receives the carrier signal from the carrier signal generator 402, and the sensed voltage from the pre-processing unit 404. The AM 408 transmits the modulated carrier signal to the ADC 110 for further processing, as described earlier.

Figure 5:
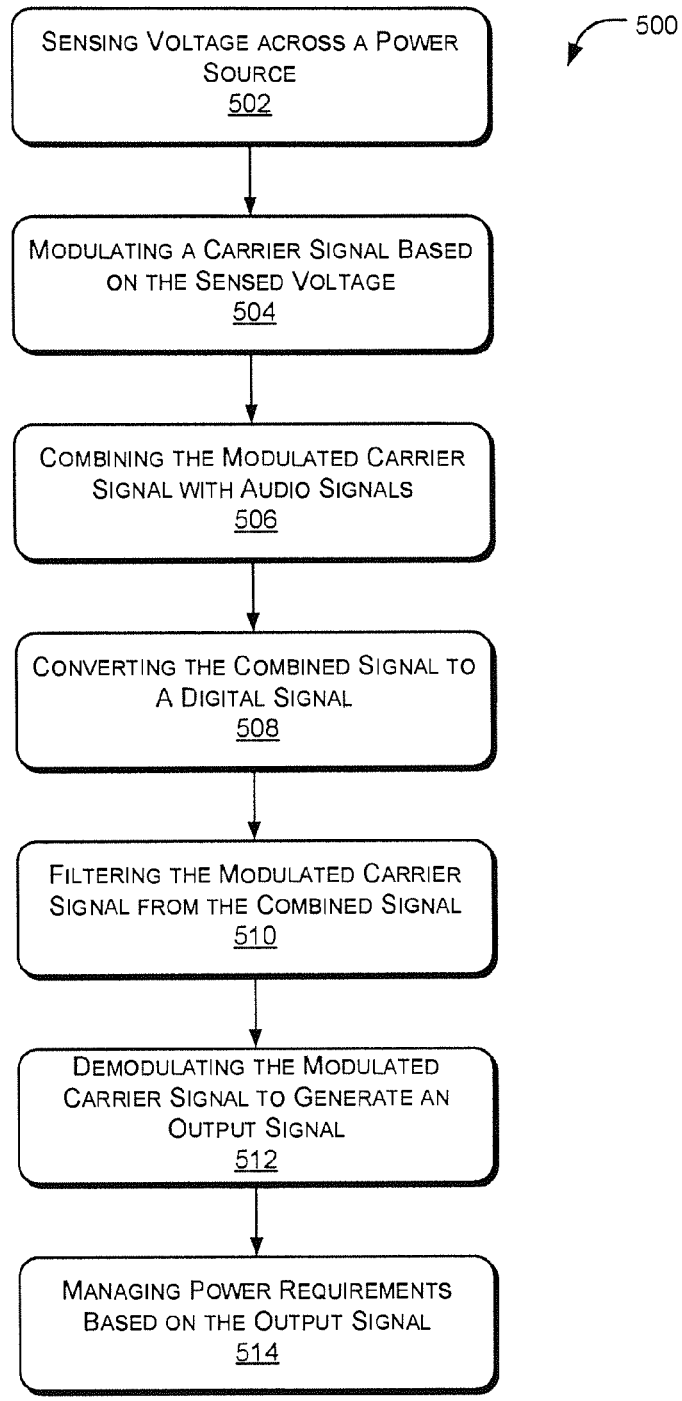
FIG. 5 illustrates an exemplary method for power measurement, in accordance with an embodiment of the present subject matter.

FIG. 5 illustrates an exemplary method 500 for power measurement in an electronic device, in accordance with an embodiment of the present subject matter. The power electronic device is configured to receive audio signals through an ADC.

The order in which the method is described is not intended to be construed as a limitation, and any number of the described method blocks can be combined in any order to implement the method, or an alternate method. Additionally, individual blocks may be deleted from the method without departing from the spirit and scope of the subject matter described herein. Furthermore, the method can be implemented in any suitable hardware, software, firmware, or combination thereof.

At block 502, voltage across a power source is sensed. The sensing can be performed by using a sensor placed across the power source, in parallel to the components of the electronic device being driven by the power source. For example, the sensor 202 is placed across the power source 104 to sense the power consumed by the electronic device 102.

At block 504, a carrier signal is modulated based on the sensed voltage. The carrier signal can be generated, and then modulated based on the sensed voltage. In one implementation, the sensed voltage can be first amplified and then used to modulate the carrier signal. The frequency of the carrier signal is chosen such that the audio signals and the modulated carrier signal do not interfere with each other. In an implementation, the frequency of the carrier signal selected is greater than the audio frequency range (20 Hz to 20 KHz). For example, the modulation unit 204 generates the carrier signal. Once generated, the modulation unit 204 modulates the carrier signal based on the sensed voltage obtained from sensor 202. In an implementation the modulation unit 204 performs amplitude modulation of the carrier signal based on the sensed voltage.

At block 506, the modulated carrier signal is combined with the audio signals received by the electronic device. The modulated carrier signal and the audio signals can be added together to generate a combined signal. In an implementation, the audio signals received by the audio interface 206 and the modulated carrier signal from the modulation unit 204 are combined together using an adder circuit.

At block 508, the combined signal including the audio signals and the modulated carrier signal is converted to a combined digital signal. The combined digital signal includes the components of the audio signals and the modulated carrier signal. It is to be noted that a single ADC can be used to convert the combined signal to the combined digital signal. For example, the ADC 110 digitizes the combined signal to generate the digitized combined signal.

At block 510, the modulated carrier signal is filtered from the combined digital signal. As the frequency of the carrier signal chosen is different from that of the audio signals, the filtering of the modulated carrier signal can be easily performed. In an implementation, a high pass filter can be used to filter the modulated carrier signal from the combined digital signal. For example, the filtering unit 210 filters out the modulated carrier signal from the digitized combined signal.

At block 512, the modulated carrier signal is demodulated to generate an output signal. The output signal is based on the sensed voltage used to modulate the carrier signal. For example, the demodulation unit 212 demodulates the digitized modulated carrier signal to generate the output signal. In an implementation, when the carrier signal is amplitude modulated based on the sensed voltage, the demodulation includes detecting an envelope of the digitized modulated carrier signal to generate the output signal.

At block 514, the power requirements of the electronic device are managed based on the output signal. For example, the demodulation unit 212 passes the output signal to the power management unit 116 for further operations, such as managing LCD backlight display and meeting power requirements of the electronic device based on the output signal.

Although embodiments for measurement of have been described in language specific to structural features and/or methods, it is to be understood that the invention is not necessarily limited to the specific features or methods described. Rather, the specific features and methods are disclosed as exemplary embodiments for testing of the shadow logic.

We claim:

1. A method for measuring power consumed by a mobile wireless communications device, the method comprising:
   modulating a carrier signal based on a sensed voltage across a power source;
   combining the modulated carrier signal with at least one wireless communication signal received by the mobile wireless communications device;
   converting the combined signal to a digital combined signal; and
   demodulating a digitized modulated carrier signal from the digital combined signal to estimate the power consumed by the mobile wireless communications device.

2. The method of claim 1 further comprising generating an output signal based on the digitized modulated carrier signal for measuring the power consumed by the electronic device.

3. The method of claim 1 wherein modulating comprises generating the carrier signal with a frequency greater than a frequency range associated with the at least one wireless communication signal.

4. The method of claim 1 wherein modulating comprises sensing the sensed voltage corresponding to the power consumed from the power source.

5. The method of claim 1 wherein demodulating comprises generating an output signal from the digitized modulated carrier signal based on the sensed voltage.

6. The method of claim 1 wherein demodulating comprises detecting an envelope of the digitized modulated carrier signal to generate the output signal.

7. A mobile wireless communications device comprising:
   a modulator configured to modulate a carrier signal based on a sensed voltage across a power source;
   an analog-to-digital converter (ADC) configured to convert the modulated carrier signal and at least one wireless communication signal received by the mobile wireless communications device into a digital combined signal; and
   a demodulator configured to demodulate a digitized modulated carrier signal from the digital combined signal to estimate the power consumed by the mobile wireless communications device.

8. The mobile wireless communications device of claim 7 wherein said demodulator is configured to generate an output signal based on the digitized modulated carrier signal for measuring the power consumed by the electronic device.

9. The mobile wireless communications device of claim 7 wherein said modulator is configured to generate the carrier signal with a frequency greater than a frequency range associated with the at least one wireless communication signal.

10. The mobile wireless communications device of claim 7 wherein said modulator is configured to modulate the carrier signal corresponding to power consumed from the power source.

11. The mobile wireless communications device of claim 7 wherein said demodulator is configured to generate an output signal from the digitized modulated carrier signal based on the sensed voltage.

12. The mobile wireless communications device of claim 7 wherein said modulator is configured to detect an envelope of the digitized modulated carrier signal to generate the output signal.

13. A non-transitory computer-readable medium having computer-executable instructions for causing a mobile wireless communications device to perform steps comprising:
   modulating a carrier signal based on a sensed voltage across a power source;
   combining the modulated carrier signal with at least one wireless communication signal received by the mobile wireless communications device;
   converting the combined signal to a digital combined signal; and
   demodulating a digitized modulated carrier signal from the digital combined signal to estimate the power consumed by the mobile wireless communications device.

14. The non-transitory computer-readable medium of claim 13 further having computer-executable instructions for causing the mobile wireless electronic device to generate an output signal based on the digitized modulated carrier signal for measuring the power consumed by the electronic device.

15. The non-transitory computer-readable medium of claim 13 wherein modulating comprises generating the carrier signal with a frequency greater than a frequency range associated with the at least one wireless communication signal.

16. The non-transitory computer-readable medium of claim 13 wherein modulating comprises sensing the sensed voltage corresponding to the power consumed from the power source.

17. The non-transitory computer-readable medium of claim 13 wherein demodulating comprises generating an output signal from the digitized modulated carrier signal based on the sensed voltage.

18. The non-transitory computer-readable medium of claim 13 wherein demodulating comprises detecting an envelope of the digitized modulated carrier signal to generate the output signal.

\* \* \* \* \*